United States Patent [19]
Mizuno et al.

[11] Patent Number: 5,686,999
[45] Date of Patent: Nov. 11, 1997

[54] PUNCH APPARATUS FOR IMPROVED REGISTRATION OF IMAGE RECEIVING MATERIAL IN AN IMAGE FORMING DEVICE

[75] Inventors: Yuji Mizuno; Shiro Kitawaki, both of Kyoto, Japan

[73] Assignee: Dainippon Screen Mfg. Co., Ltd., Kyoto, Japan

[21] Appl. No.: 499,391

[22] Filed: Jul. 7, 1995

[30] Foreign Application Priority Data

Jul. 28, 1994 [JP] Japan .................................. 6-177201

[51] Int. Cl.$^6$ ........................................................ G03G 1/15
[52] U.S. Cl. ........................... 358/296; 347/116; 399/301; 358/504
[58] Field of Search ............................ 101/481; 347/116; 355/212, 213; 382/151; 358/296, 504, 452, 453, 537; 399/301

[56] References Cited

U.S. PATENT DOCUMENTS

| | | |
|---|---|---|
| 1,559,987 | 11/1925 | Reinhardt . |
| 2,963,932 | 12/1960 | Glueck . |
| 3,368,439 | 2/1968 | Bungay, Jr. . |
| 3,894,458 | 7/1975 | Borello .................................. 83/322 |
| 3,916,744 | 11/1975 | West .................................... 83/75 |
| 3,943,810 | 3/1976 | Muylle .................................. 83/337 |
| 4,033,050 | 7/1977 | Kaprelian ............................. 35/9 R |
| 4,134,319 | 1/1979 | Clark .................................... 83/100 |
| 5,390,001 | 2/1995 | Ishiwata et al. ..................... 355/85 |

FOREIGN PATENT DOCUMENTS 0 591 959 10/1993 European Pat. Off. .

Primary Examiner—Peter S. Wong
Assistant Examiner—Derek J. Jardieu
Attorney, Agent, or Firm—Lowe, Price, LeBlanc & Becker

[57] ABSTRACT

A punch mechanism for an image recording device 1 that is disposed in an image recording device 1 which has a recording drum 11 in which photo-sensitive material F may be arranged on the peripheral surface and a main frame body 17 within the image recording device 1 which supports the recording drum 11 and allows it to selectively rotate. The punch unit P1 is an mechanism that forms a plurality of punch holes in the photo-sensitive file F arranged on the recording drum 11 and consists of at least one punch assembly 21 located on the outer periphery of the recording drum 11, at least one die 20, and a drive assembly 22. The punch assembly 21 opens punch holes in the photo-sensitive material F. The die 20 has a die hole 26 coupled to a punch 31 of the punch assembly 21. The drive assembly 22 drives the punch 31.

24 Claims, 18 Drawing Sheets

PUNCH APPARATUS FOR IMPROVED REGISTRATION OF IMAGE RECEIVING MATERIAL IN AN IMAGE FORMING DEVICE

BACKGROUND OF THE INVENTION

A. Field of the Invention

The invention relates to a punch mechanism, and more particularly to a punch mechanism disposed in an image recording device which has a selectively rotatable recording drum on which a photo-sensitive material may be arranged around the peripheral surface thereof, the punch mechanism forming punch holes in the photo-sensitive material.

B. Description of the Related Art

Generally, punch holes are formed in a photo-sensitive material in order to properly register the material during printing or exposure. For example, during color printing, a sheet of photosensitive material is used for each color (such as yellow, magenta, cyan and black). One complete color image is produced when the images on these individual sheets are superimposed and printed. In order to prevent deviations in the final printed image, identical sets of punch holes are formed on each sheet of photo-sensitive material. After these punch holes have been formed, each sheet of photosensitive materials for each color can be aligned and thus a clear image can be produced.

In order to eliminate the operation of accurately aligning the individual sheets of photo-sensitive material, an mechanism to open punch holes in an image recording device has already been proposed. This image recording device has a recording drum with photosensitive material arranged on the surface of the drum and a pair of punch units disposed on both peripheral edges of the recording drum. These punch units are generally disposed at a position to retain the leading edge of the photo-sensitive material on the recording drum and comprise a punch pin, a die, and a drive means to drive the punch pin. In these punch units, punch holes are only formed along the leading edge of the photo-sensitive material.

However, punch holes must be formed along the length of the photo-sensitive material in order to improve the registration accuracy. In the conventional configuration described above, when the length of the photo-sensitive material is disposed along the axial direction of the recording drum, two punch holes are formed along the length of the photo-sensitive material. When the length of the photo-sensitive material is disposed along the outer periphery of the recording drum, two punch holes cannot be formed along the length of the photo-sensitive material. Consequently, a separate punch mechanism must be used.

When one wants to form a plurality of punch holes along the length of the photo-sensitive material when it is disposed along the outer periphery of the recording drum it is conceivable to dispose a plurality of punch units along the outer periphery of the recording drum. However, if a plurality of dies are disposed so as to protrude over the peripheral edges of the recording drum, the dies may interfere with the photo-sensitive material when it is mounted or removed from the recording drum.

Furthermore, in a conventional device, a drive means to drive the punch pins must be disposed on the recording drum, as well as special connection parts and rotating joints required for the drive means wiring.

SUMMARY OF THE INVENTION

It is therefore an object of the invention to form a plurality of punch holes along the outer periphery of the photo-sensitive material arranged on the recording drum in a simple, reliable and efficient manner.

Another object of the invention is to allow photo-sensitive material to be easily mounted or removed from the recording drum.

Yet another object of the invention is to simplify the structure of the wiring to the drive means.

A punch mechanism for an image recording device according to one aspect of the present invention, is a mechanism disposed in an image recording device which has a recording drum in which a photo-sensitive material may be arranged around the peripheral surface of the drum. A main frame body within the image recording device supports the recording drum and allows it to selectively rotate while a plurality of punch holes are formed in the photo-sensitive material arranged on the recording drum. The punch mechanism includes at least one punch pin, at least one die, and at least one drive means. The punch pins create punch holes in the photosensitive material, the dies have holes which allow the punch pins to be inserted therein, and the drive means drive the punch pins. At least one of either the punch pins, die or drive means are located in the main frame body.

After mounting the photo-sensitive material around the peripheral surface of the recording drum and recording an image on the photo-sensitive material the punch pins are driven by the drive means. As a result, punch holes are formed in the photo-sensitive material arranged between the punch pin and die. At least one piece from among the punch pin, die and drive means of the punch units are located in the main frame body. Hence, the recording drum can be rotated to align the position of the other components of the punch units disposed on the recording drum or the position of the punch units disposed in the main frame body can be matched to the punch hole formation position.

Continuing this operation, when all of the punch holes have been formed, the photo-sensitive material mounted on the recording drum is discharged from the image recording device. Because there does not need to be a separate punch unit for each punch hole desired, the structure of the device is simplified.

In another aspect of the present invention, the punch mechanism has at least one die located in the main frame body. The die does not interfere with the mounting of the photo-sensitive material or its discharge. Moreover, with the die disposed on the main frame body, a plurality of holes can be made on the outer periphery of the photo-sensitive material, thus simplifying the structure.

In another aspect of the present invention, a positioning means is included that aligns the punch hole with the other components of the punch unit. The positioning means allows accurate alignment between the punch holes and the punch units regardless of whether the punch pins and punch driving means are disposed on the main frame body or on the recording drum. This allows for a simpler structure.

In yet another aspect of the present invention, a plurality of punch pins and drive means are disposed on the outer periphery of the recording drum and the die is disposed on the main frame body. Here, the number of punch pins and drive means is equal to the number of punch holes that may be made in the photo-sensitive material, but only one die is necessary for each side of the recording drum. Consequently, the structure of the mechanism is made more simple.

In another aspect of the present invention, a plurality of punch pins are disposed on the outer periphery of the recording drum and a drive means and die are disposed on the main frame body. Here, although a plurality of punch pins are disposed on the outer periphery of the recording drum, only one drive means and die are necessary. Consequently, the structure of the mechanism is made more simple.

In still another aspect of the present invention, the drive means and die are all disposed on the main frame body. Thus, a plurality of holes can be formed in the outer periphery of the photo-sensitive material with only one punch unit, making the structure of the mechanism simpler.

In another aspect of the present invention, the photo-sensitive material is disposed on the recording drum so that its peripheral edges extend over the outer periphery of the recording drum and in between the die and the punch pin such that a punch hole may be formed in the photo-sensitive material. Further, these components are all disposed on the main frame body. Here, a punch hole can be formed at various positions along the edge of the photo-sensitive material by rotating the recording drum to the appropriate position.

In another aspect of the present invention, a driving means is further included to move the die in a direction away from the surface of the photo-sensitive material on the recording drum. Here, when the punch holes are to be made, the die can be moved toward the surface of the recording drum and after the punch operation has been completed, the die can be moved away from the surface of the recording drum in a radial or axial direction. As a result, the photo-sensitive material on the recording drum may be protected from damage while the drum is rotating.

In another aspect of the present invention, at least one drive means is disposed on the main frame body. Here, a plurality of holes can be formed in the peripheral direction of the recording drum with respect to the photo-sensitive material with only one drive means on the main frame body. Consequently, the structure of the mechanism is made simpler. Moreover, because the drive means is located on the main frame body, the structure of the wiring to the drive means is simplified.

In another aspect of the present invention, a plurality of dies and punch pins are disposed on the outer periphery of the recording drum. Here, even though there can only be as many punch holes as there are dies and punch pins, only one drive means is required. Consequently, the structure of the mechanism is simplified.

In still another aspect of the present invention, a punch pin is disposed on the main frame body and a plurality of dies are disposed on the outer periphery of the recording drum. Here, only one drive means and punch pin is required. Consequently, the structure of the mechanism is simplified.

In another aspect of the present invention, a punch pin is disposed on the outer periphery of the recording drum and a die is formed integrally with the recording drum. Here, the die and punch pin do not interfere with the mounting or discharge of the photo-sensitive material.

In still another aspect of the present invention, a punch mechanism for forming alignment holes in material includes a main frame body within an image recording device and a selectively rotatable recording drum supported on the main frame body having an outer peripheral surface around which a photo-sensitive material may be selectively positioned. A die mechanism having an extending surface formed with a die hole therein and including a solenoid is mounted on the main frame body for relative movement of the extending surface with respect to the recording drum. At least one punch pin and drive means is associated with the die mechanism.

In one embodiment of the present invention, the extending surface is moveable by the solenoid in radial directions with respect to the recording drum. In another embodiment, the extending surface is moveable by the solenoid in a direction generally parallel to a central axis of the recording drum.

In still another embodiment of the punch mechanism, the punch pin and the drive means are mounted to the recording drum.

In still another embodiment of the punch mechanism, the punch pin is mounted to the recording drum and the drive means is mounted to the main frame body.

In still another embodiment of the punch mechanism, the punch pin and the drive means are mounted to the main frame body.

In still another embodiment of the punch mechanism, the solenoid comprises a magnetic coil and a displaceable pin, one end of the displaceable pin being the punch pin.

These and other objects, features, aspects and advantages of the present invention will become more fully apparent from the following detailed description of the present invention when taken in conjunction with the accompanying drawings where like reference numerals denote corresponding parts throughout, in which:

DETAILED DESCRIPTION OF THE PREFERRED EMBODIMENTS

Figure 1:
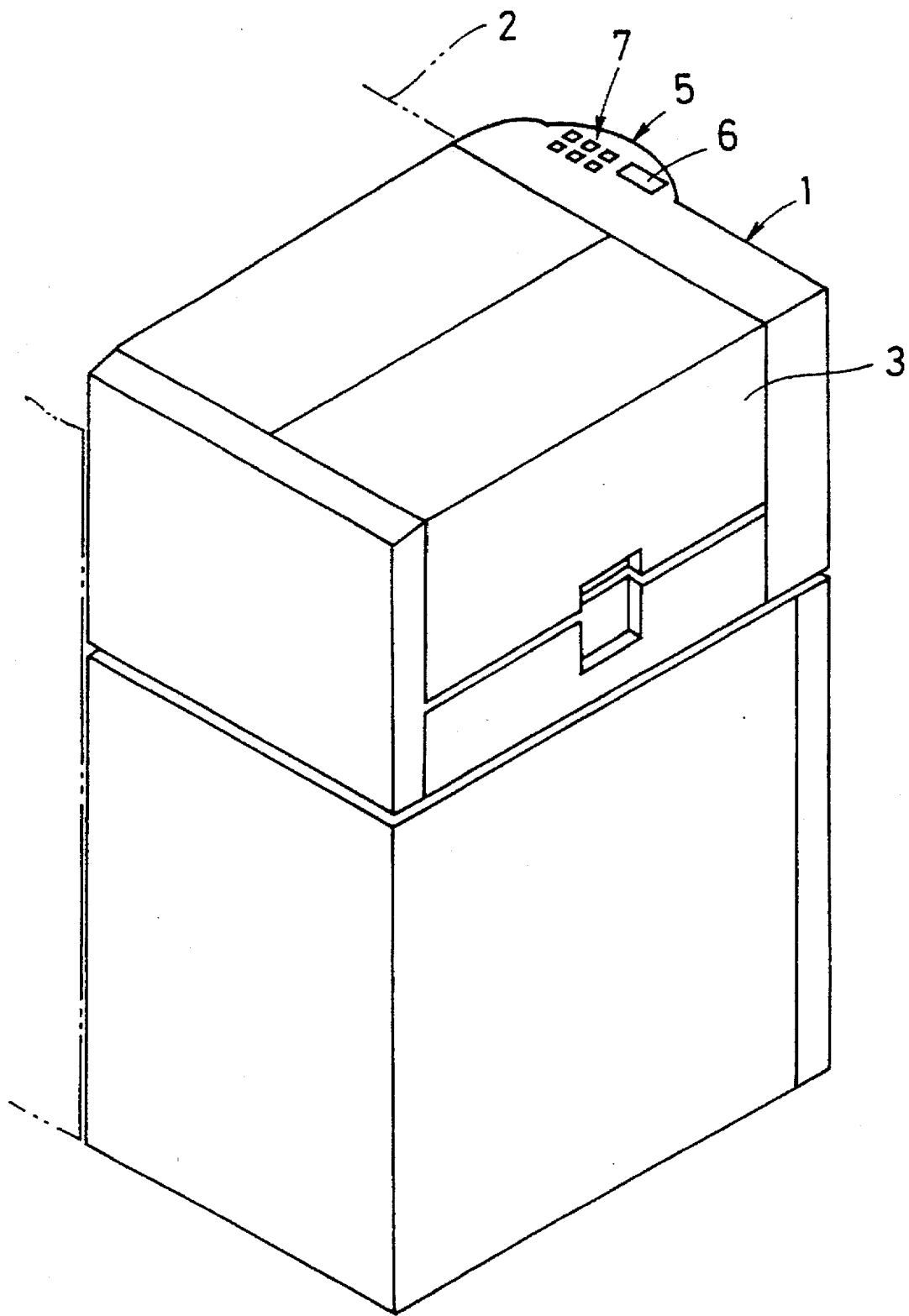
FIG. 1 is a perspective view of the image forming device that employs the present invention.

In FIG. 1, an image forming device 1 is depicted. A door 3 is disposed on the side of the image forming device 1 in a first preferred embodiment of the present invention for the purpose of inserting and removing material rods.

On the upper surface of the image forming device 1, an operation panel 5 is disposed. In the operation panel 5, a liquid crystal display unit 6 and various input keys 7 are provided. Further, on the other side, a material discharge opening 1a (see FIG. 2) is provided that allows material that has been exposed to be discharged. An automatic developing mechanism 2 can be connected adjacent to the material discharge opening 1a.

Figure 2:
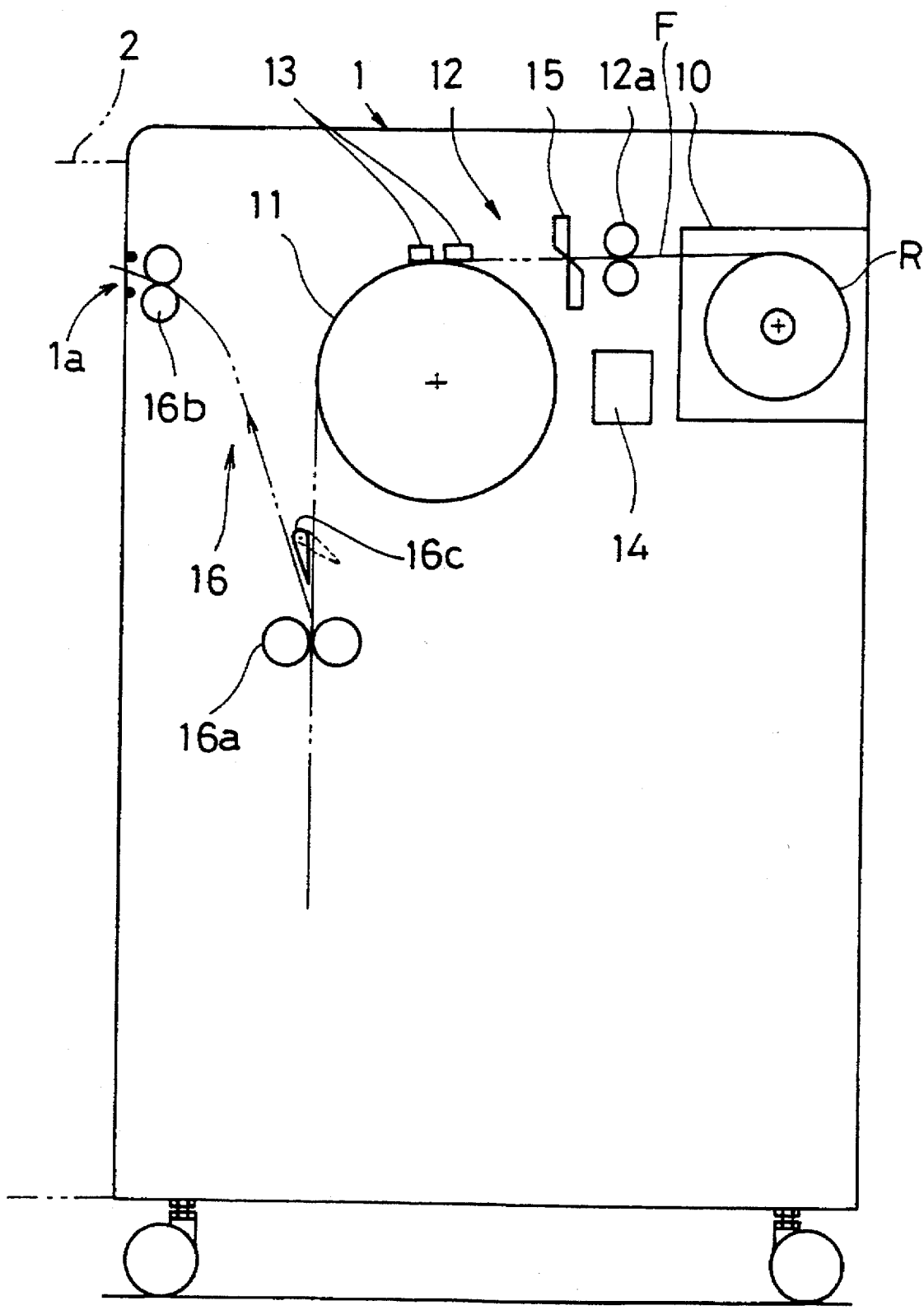
FIG. 2 is a schematic view of the image forming device depicted in FIG. 1, showing various internal components of the image forming device, including a recording drum.

As shown in FIG. 2, inside the image forming device 1, a material magazine 10 that stores material rolls and a recording drum 11 are disposed. A photo-sensitive material F may be mounted around the peripheral surface of the recording drum 11 after a section of material has been cut from the material roll R. The recording drum 11 can be selectively rotated using a motor (not shown) and can hold the supplied photo-sensitive material F using vacuum suction (not shown) and a hold-down plate 13.

A supply mechanism 12 is disposed between the material magazine 10 and the recording drum 11 and includes a pair of rollers 12a which transport the photo-sensitive material F to the recording drum 11. In the supply mechanism 12, cutter 15 is disposed to cut the material that is supplied from the material magazine 10. The cutter 15 cuts the material in response to image size information or material size information input from an external system (not shown) that supplies the original image data or from the input keys 7.

On the right side of the recording drum 11, in FIG. 2, an exposure head 14 is disposed which emits modulated light onto the photo-sensitive material mounted on the recording drum 11 corresponding to the image dam supplied to it. The exposure head 14 is an LED array with a plurality of LED elements arranged in a row in the axial direction of the recording drum 11 and can move back and forth along the axial direction of the recording drum 11.

On the side opposite the supply mechanism 12 with respect to the recording drum 11, a discharge mechanism 16 is disposed that discharges photo-sensitive material F that has been exposed. The discharge mechanism 16 includes a pair of rollers 16a that selectively rotate both in forward and reverse directions and are disposed below the recording drum 11. The discharge mechanism 16 further includes a pair of rollers 16b arranged adjacent to the discharge opening 1a and a switching claw 16c. After the photo-sensitive material F has been exposed and is to be discharged from the image recording machine 1, the switching claw 16c moves to a position, as shown in solid lines in FIG. 2, which allows the material to be moved away from the recording drum 11 by means of rollers 16a. The switching claw 16c then moves to a second position, shown in phantom in FIG. 2, which allows the photo-sensitive material F to be directed toward rollers 16b, the rolling direction of the rollers 16a are reversed, and the photo-sensitive material F on the rollers 16a is moved into the automatic developing mechanism 2 by means of the rollers 16b. The photo-sensitive material F is discharged into the automatic developing mechanism 2 with its exposed portion facing down. This is necessary because the surface of the photo-sensitive material must be face down during development.

Figure 3:
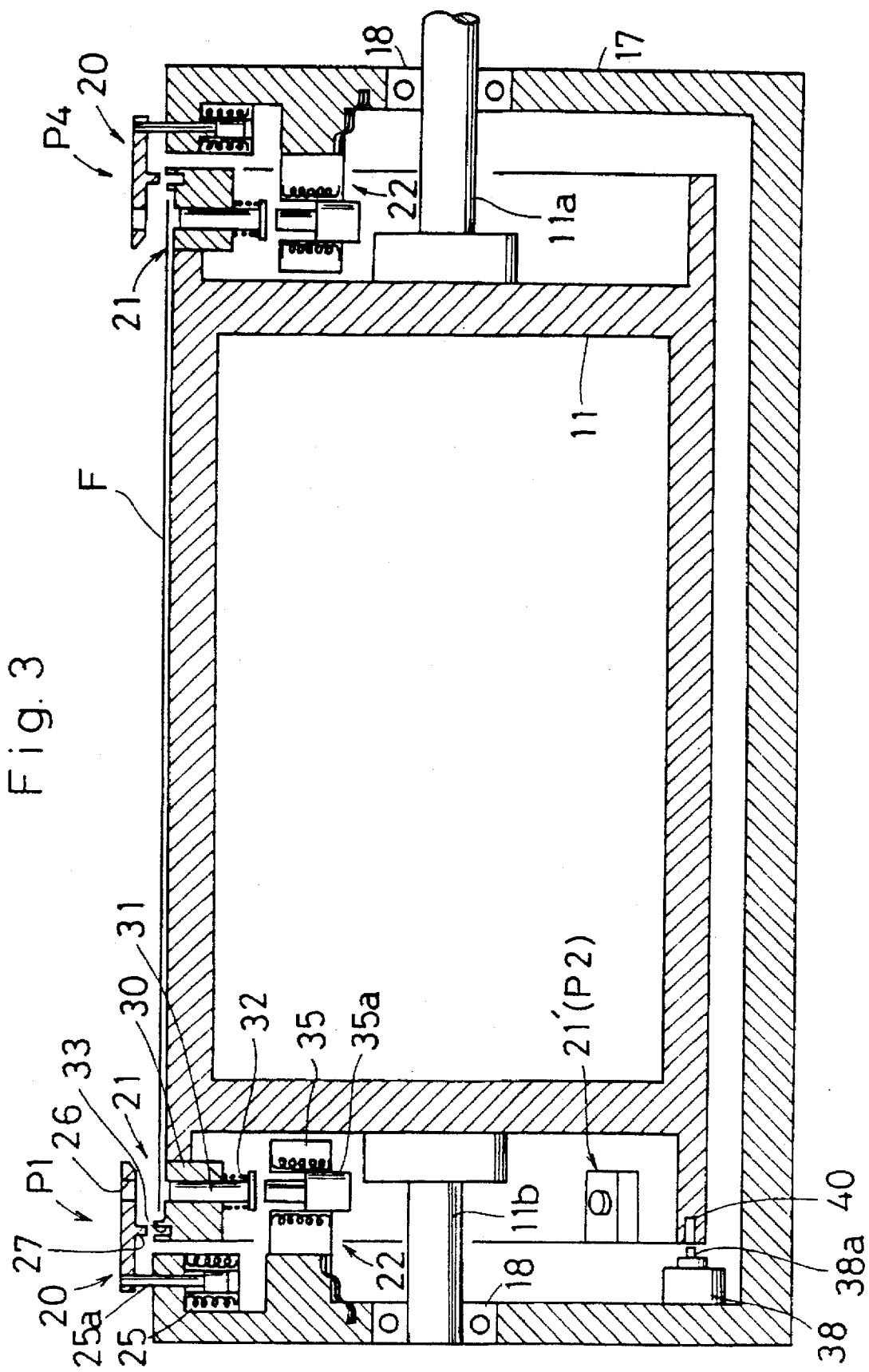
FIG. 3 is a fragmentary, part elevation, part section of the recording drum depicted in FIG. 2, showing adjacent interacting parts, in a first embodiment of the present invention.
Figure 4:
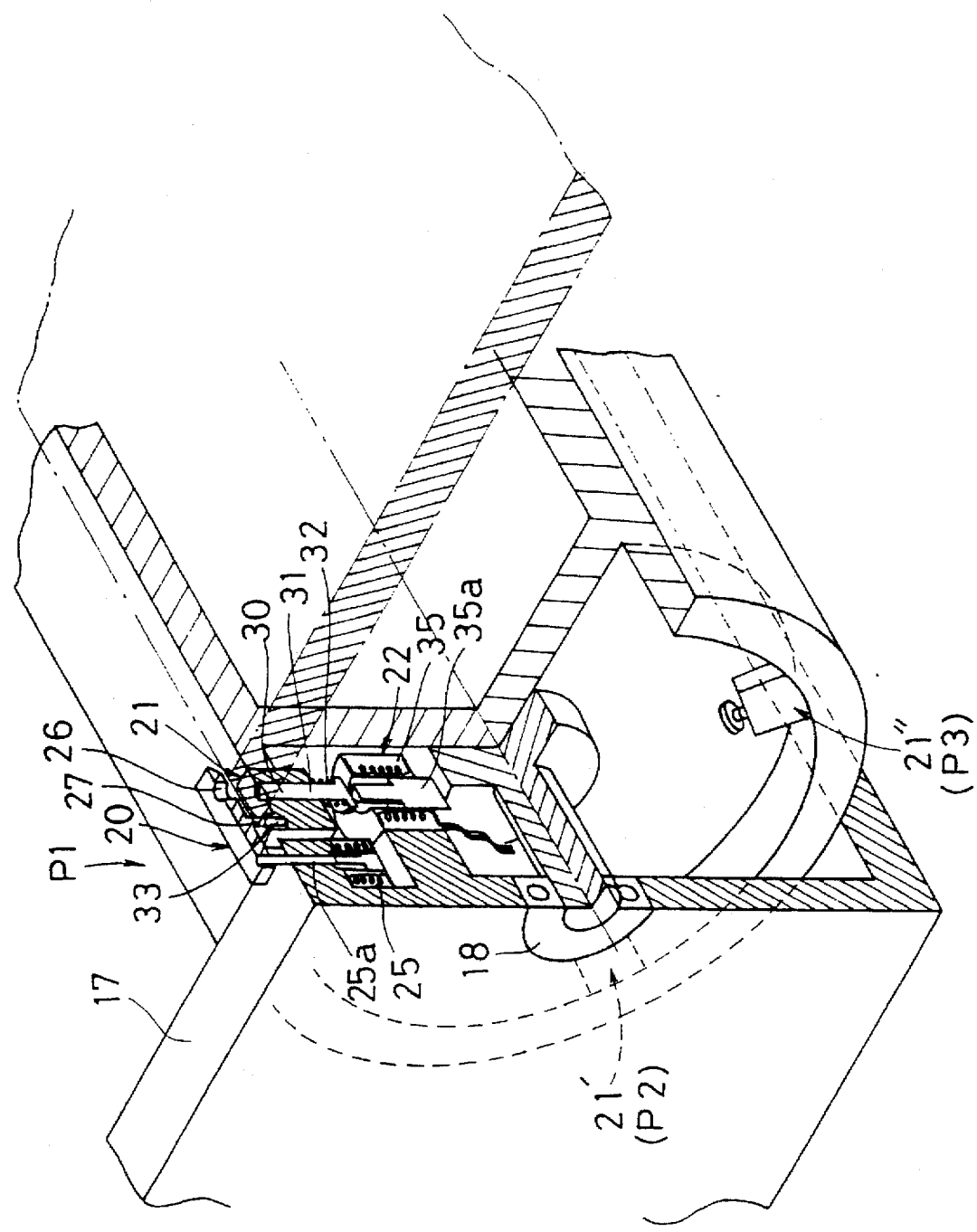
FIG. 4 is a fragmentary perspective and part section view of the recording drum shown in FIGS. 2 and 3.

As shown in FIG. 3 and 4, the recording drum 11 has shaft portions 11a, 11b which extend from each side of recording drum 11.

The shaft portions 11a, 11b are supported by bearings 18 located in the main frame body 17 which allows the shaft portions 11a, 11b and the recording drum 11 to be selectively rotated. Furthermore, the recording drum 11 has a drum length that can accept the short side of an A1 size photo-sensitive material F. Consequently, for an A1 size image, the long side of the photo-sensitive material F is arranged along the peripheral direction and, for an A2 size image, the long side of the photo-sensitive material F is arranged along the axial direction.

In a first embodiment of the present invention as shown in FIGS. 3 and 4, punch units P1 and P4 are disposed on both edges of the recording drum 11. The punch units P1 and P4 include a die 20 supported on the main frame body 17 to selectively move up and down with respect to the main frame body 17, a punch assembly 21 disposed on the recording drum 11, and a drive assembly 22 disposed on the main frame body adjacent to the die 20. The die 20 is connected to the tip of a solenoid shaft 25a of a die solenoid 25 fixed to the main frame body 17. The die 20 is positioned above a portion of the surface of the recording drum 11. A die hole 26 is formed on the tip of the die 20. Further, a coupling projection 27 is formed on the underside of each of the two dies 20 and the coupling projections 27 are opposed to opposite edges of the recording drum 11.

As can be seen from FIG. 3, there are two dies 20 and drive assemblies 22 disposed on the main frame body 17, shown in the top portion of the figure. FIG. 3 also shows a third punch assembly 21' on the lower left periphery of the recording drum 11. However, not shown in FIG. 3 is a fourth punch assembly 21" (in FIG. 4) also on the lower left periphery of the recording drum 11. The third and fourth punch assemblies 21' and 21' disposed on the lower left periphery of the recording drum 11 are radially spaced apart from each other and aligned axially with the first single punch assembly 21 on the left side of the drum 11. When the recording drum 11 is rotated so as to place one of the lower punch assemblies 21' or 21" directly underneath the die 20, the combination of die 20 and, for example, the third punch assembly 21' function as punch unit P2. Further, when the recording drum 11 is rotated so as to place the remaining punch assembly 21' directly underneath the die 20, the combination of the die 20 and the punch assembly 21' function as punch unit P3.

As is shown in FIG. 3, each punch assembly 21 includes a punch guide 30, a punch pin 31 that is disposed in the punch guide 30 and that can be selectively raised and lowered with respect to the surface of the recording drum 11, and a return spring 32 that is attached to both the punch guide 30 and the punch pin 31 and applies a force to the punch pin 31 that prevents it from prematurely extending above the surface of the recording drum 11 without external force.

A coupling hole 33 is formed on the punch guide 30 of the drum 11 opposite to the coupling protrusion 27. When the recording drum 11 is rotated so as to align one or more of the punch assemblies 21 with dies 20, either of dies 20 may be lowered so that the coupling protrusion 27 connects with the coupling hole 33, thereby aligning the die hole 26 in die 20 with the punch pins 31 fixed to the recording drum 11.

The punch pin 31 has an outer diameter that allows it to fit securely in the die hole 26.

The drive assembly 22 includes a punch solenoid 35 mounted to the frame body 17. The punch solenoid 35 has a solenoid shaft 35a that can be selectively extended up and down from the punch solenoid 35.

In the lower left portion of the main frame body 17 a positioning solenoid 38 is mounted which assists in assuring the alignment of punch assemblies 21 with the dies 20. Positioning holes 40 are formed at three locations along the edge of the recording drum 11 corresponding to the spaced apart intervals between pairs of punch assemblies 21. A solenoid shaft 38a and a positioning solenoid 38 are disposed on the main frame body 17 so as to allow the solenoid shaft 38a to be inserted into one of the positioning holes 40 when the drum 11 is in proper alignment with the main frame body 17.

By rotating the recording drum 11, each punch assembly 21 can be aligned with the dies 20 and drive assembly 22 thereby requiring only one die and one drive assembly. Consequently, the structure of punch units P1 to P4 is simplified.

Figure 5:
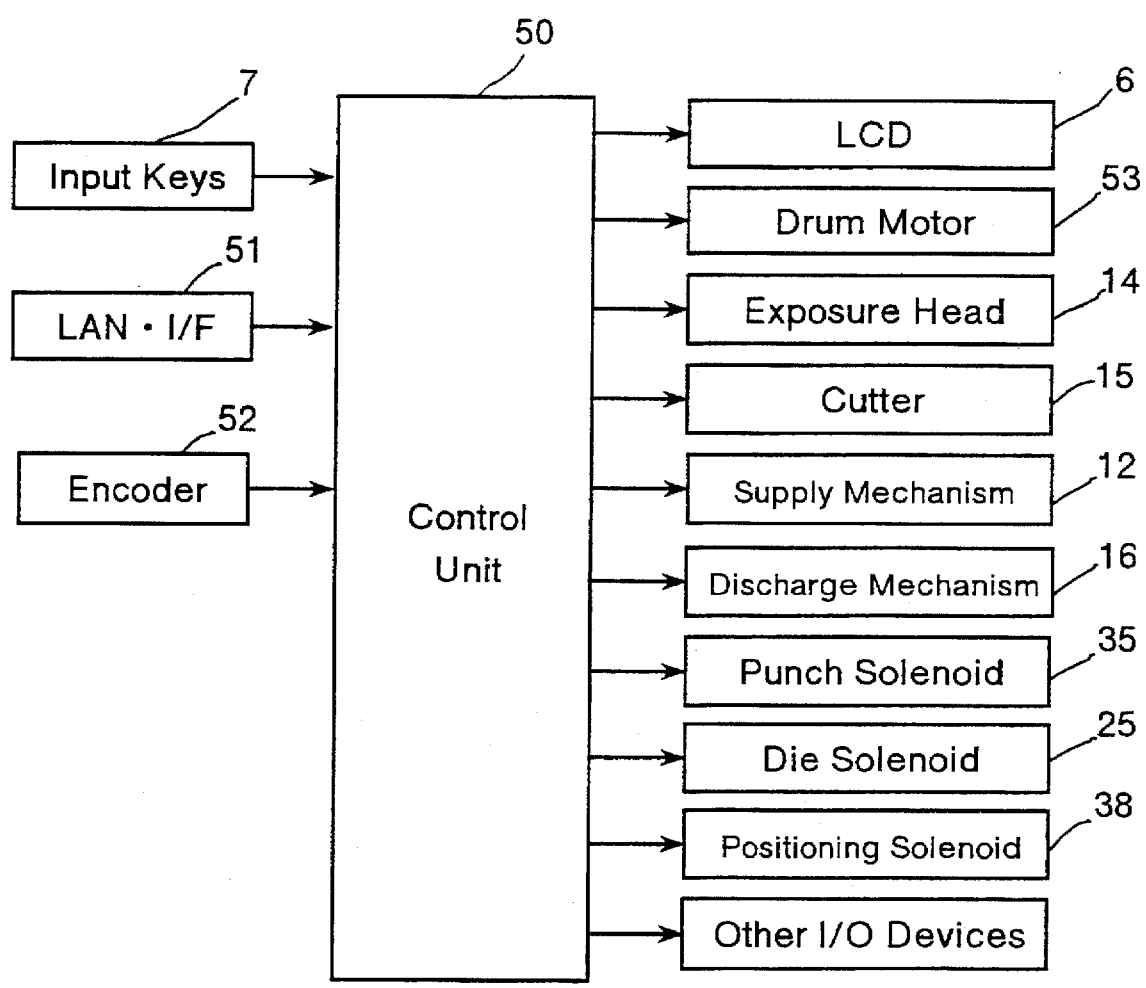
FIG. 5 is a block diagram showing the organization of the control system of the image forming device depicted in FIGS. 1 and 2.

The image forming device 1 has a control unit 50 shown in FIG. 5. The control unit 50 includes a microcomputer which includes a CPU, RAM and ROM. Input keys 7, a local area network (hereinafter referred to as a LAIN) interface 51 and an encoder 52 are connected to the control unit 50. The encoder 52 is coupled to a drum motor 53 that drives and rotates the recording drum 11. The encoder 52 provides a signal that indicates the relative position of the drum 11. The LAN interface 51 is connected to a LAN which is in turn connected to the external system to create image data. Furthermore, the liquid crystal display unit 6, the drum motor 53 for driving the recording drum 11, the exposure head 14, the cutter 15, the supply mechanism 12, the discharge mechanism 16, the punch solenoid 35, the die solenoid 25, the positioning solenoid 38, and other I/O units are all connected to the control unit 50.

Figure 6:
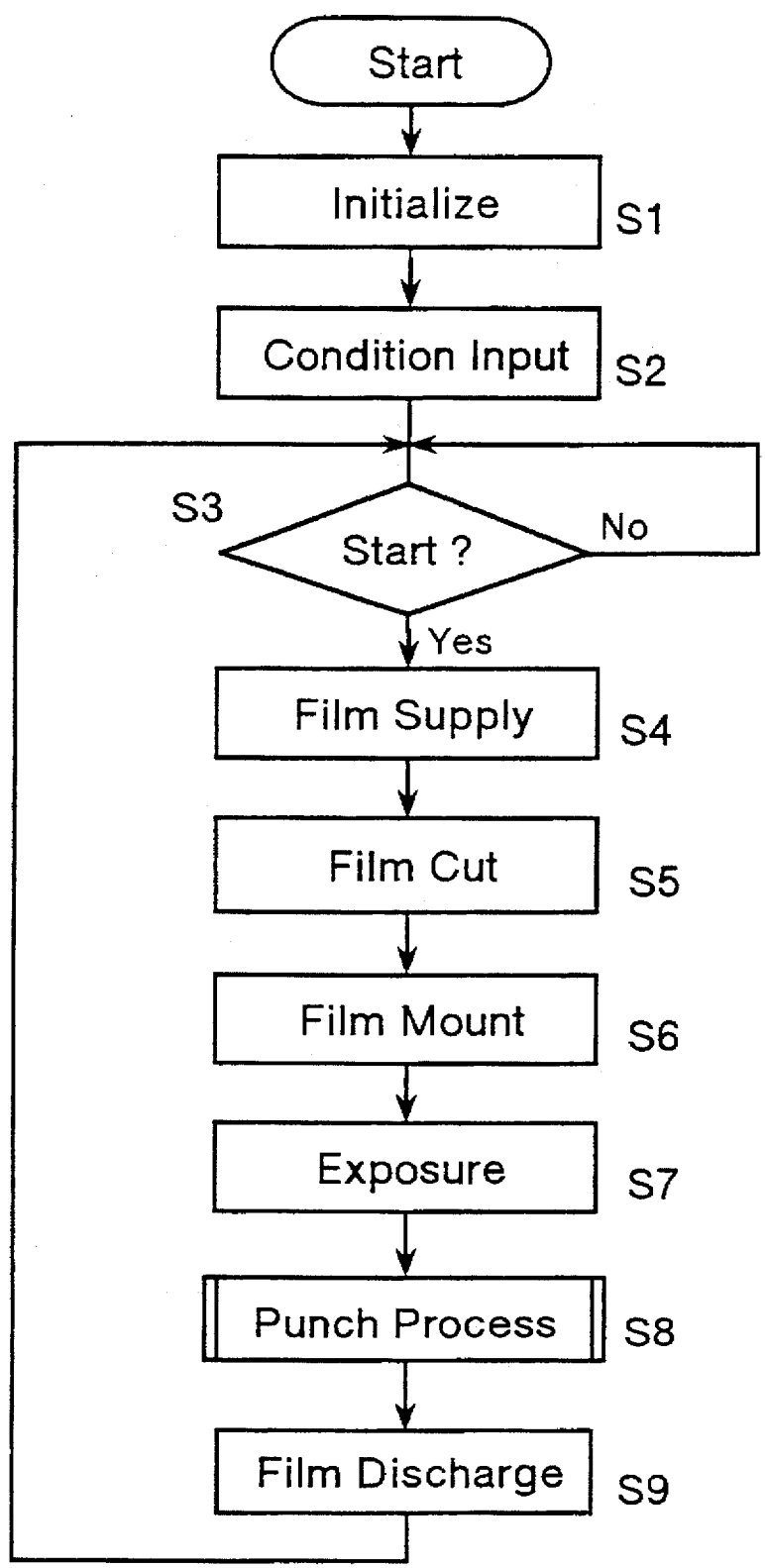
FIG. 6 is a flowchart showing the control operation of control system depicted in FIG. 5.

Next, the operation of the image forming device 1 will be explained by reference to FIGS. 6 and 7.

When the power supply is turned ON, the initial settings in step S1 are set. Here the initial settings are executed, with the recording drum 11 moved to a predetermined, standard position and the exposure head 14 moved to the exposure start position. By turning OFF the die solenoid 25, the dies 20 are moved to a shelter position (the position shown in FIG. 3) spaced apart from the recording drum 11. In step S2, the input exposure conditions, mode and image data size are received. In step S3, the control unit 50 waits for the exposure start command. This exposure start command is sent from an operator via the input keys 7 or from the external system via the LAN interface 51. In step S4, the supply mechanism 12 supplies a piece of material to the recording drum 11 from the material magazine 10. In step S5, the cutter 15 cuts the material in response to the image data size obtained in step S2. At this point if the image size is A1, the material is cut to a long size and if the image size is A2, the material is cut to a short size.

In step S6, material F which was cut from the material roll is mounted onto the surface of the recording drum 11 by vacuum suction. In step S7, while the exposure head 14 is being moved in the axial direction of the recording drum 11, the photo-sensitive material F mounted on the recording drum 11 is exposed to LED light from the exposure head 14 modulated in response to the image data, and an image is recorded onto the photo-sensitive material F. After image recording has been completed, punch operation processing, which will be explained later, is carried out in step S8. In step S9, the discharge mechanism 16 discharges the material. When the operation in step S9 is completed, the flow returns to step S3 and waits for the exposure start command.

Figure 7:
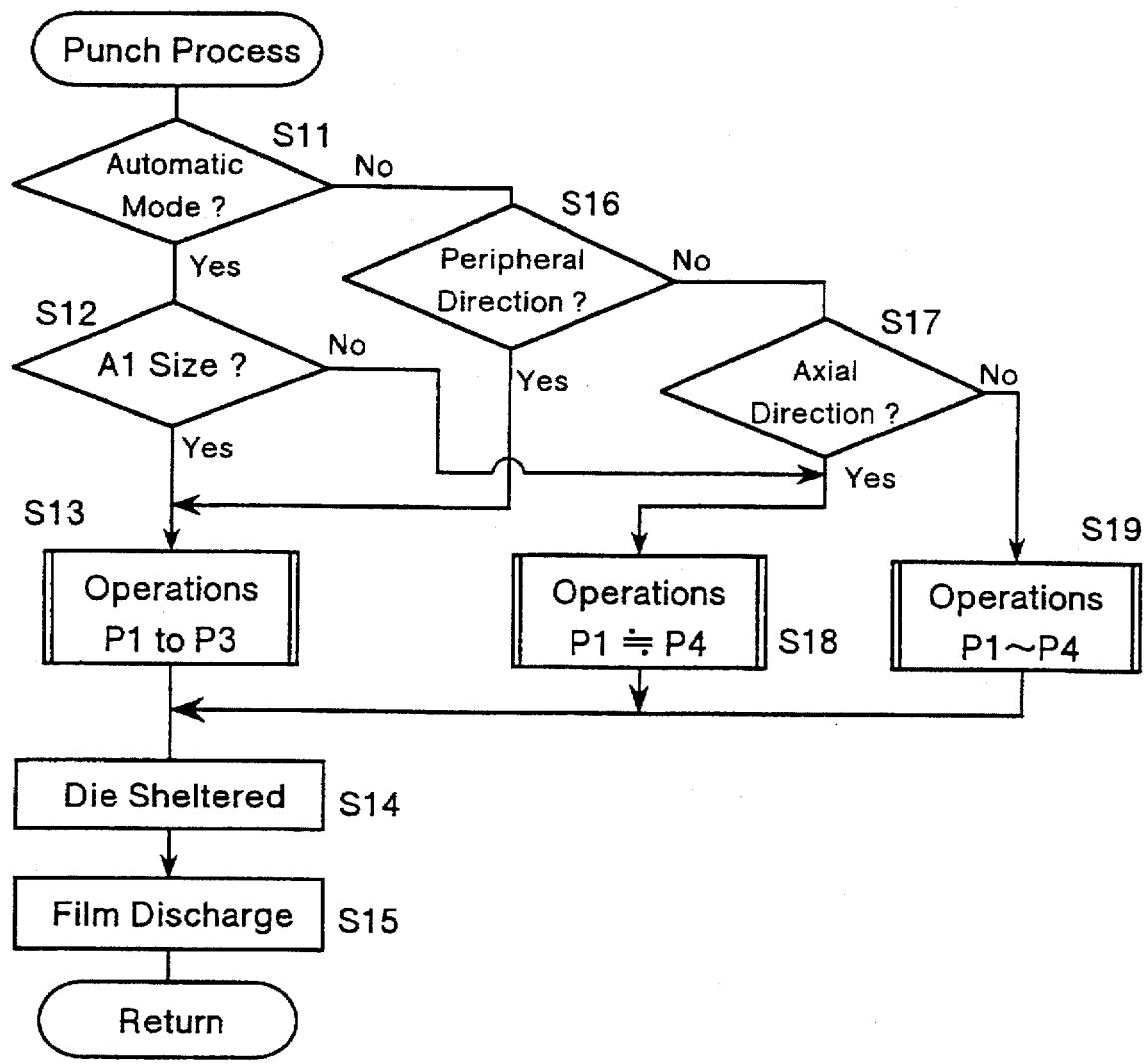
FIG. 7 is another control flowchart of the punch processing operation.

FIG. 7 shows the detailed flow of the punch operation processing of step S8. When image exposure is completed, punch operation processing begins. In step S11, a judgment is made as to whether or not the processing mode is set to automatic. When the processing mode is set to automatic, the flow proceeds to step S12 and when not set to automatic, the flow proceeds to step S16. The processing mode determines where holes are to be made on the photo-sensitive material F. If the processing mode is set to automatic, where on the photo-sensitive material F the punch holes will be made is determined automatically according to the image size (the size of the photo-sensitive material). When the processing mode is not set to automatic, punch holes will be made in accordance with the punch alignment direction preset by step S2 without any regard to the current size of the material.

In step S12, a judgment is made as to whether the size of the photo-sensitive material mounted on the recording drum 11 is size A1 or not. When the size is A1, the flow moves to step S13 and executes operation processes P1 to P3 to operate punch units P1 to P3 in order. If the size is not A1, the flow moves to step S18 and executes operation processes P1 and P4 to simultaneously operate punch units P1 and P4.

In step S16, a judgment is made as to whether "peripheral direction" is set as the punch arrangement direction. When the setting is "peripheral direction", the flow moves to step S13 and when the setting is not "peripheral direction", the flow moves to step S17. Continuing to step S17, when it is determined that "axial direction" is set as the punch arrangement direction, the flow moves to step S18 and when it is determined that neither "peripheral direction" nor "axial direction" are set as the punch arrangement direction, the flow moves to step S19 and executes operation processes P1 to P4 to operate all punch units P1 to P4.

Next, the details of the punch process in steps S13, S18, and S19 will be explained.

Figure 8:
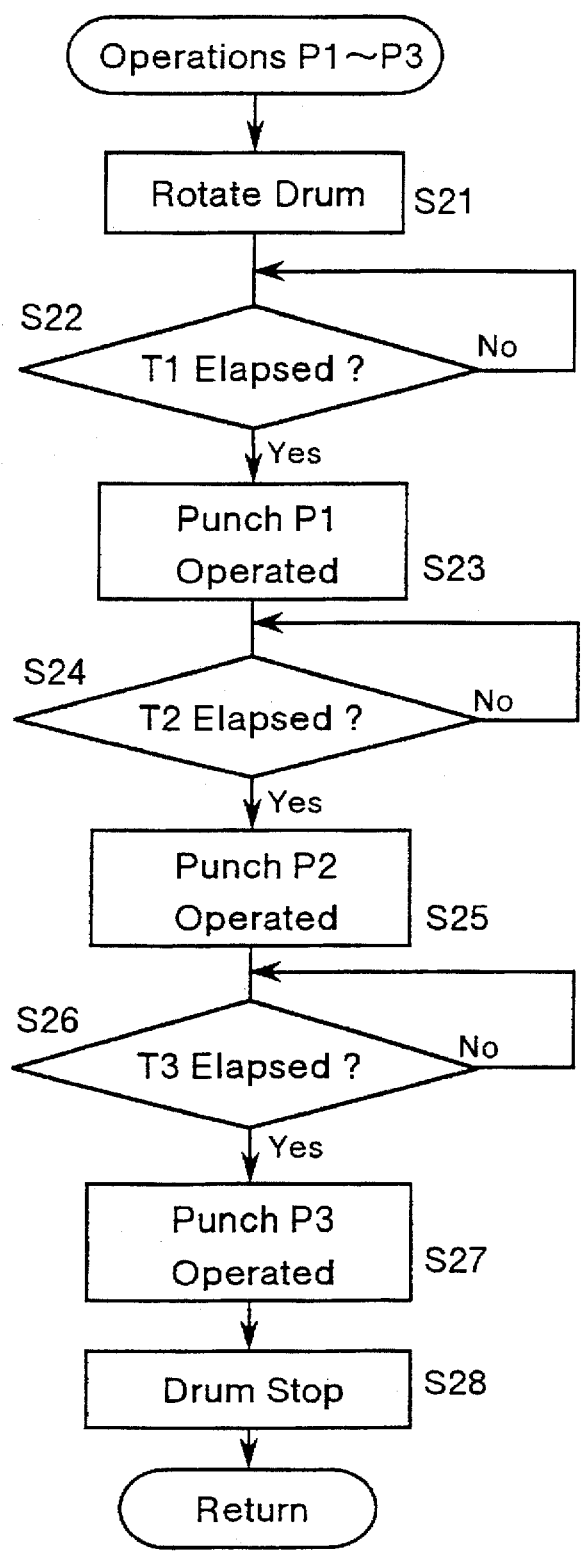
FIG. 8 is another control flowchart of the punch processing operation.

FIG. 8 shows the detailed flow of step S13. In step S21, the recording drum 11 is rotated. Here, compared to the rotation speed during image recording, the recording drum rotates quite slowly. Step S22 waits for time T1 to elapse. The time T1 is the time from when the recording drum 11 begins rotating until the components of punch unit P1 are aligned. When time T1 elapses, the flow moves to step S23 and executes punch unit P1. At this point the die 20 is moved to the punch position by activating the die solenoid 25, a punch hole is formed in the photo-sensitive material by activating the punch solenoid 35a, and the die 20 is then moved to the shelter position by deactivating the die solenoid 25.

Step S24 waits for time T2 to elapse. The time T2 is the time the recording drum 11 begins to roll until the components of punch unit P2 are aligned. When time T2 elapses, the flow moves to step S25. In step S25, identical to step S23, the operation of punch trait P2 executes. In step S26 and S27, the processing of punch unit P3 is identical to that of punch units P1 and P2. When these processes are complete, the drum rotation stops in step S28. In this way, three punch holes are formed on the photo-sensitive material along the left periphery of the recording drum 11.

Figure 9:
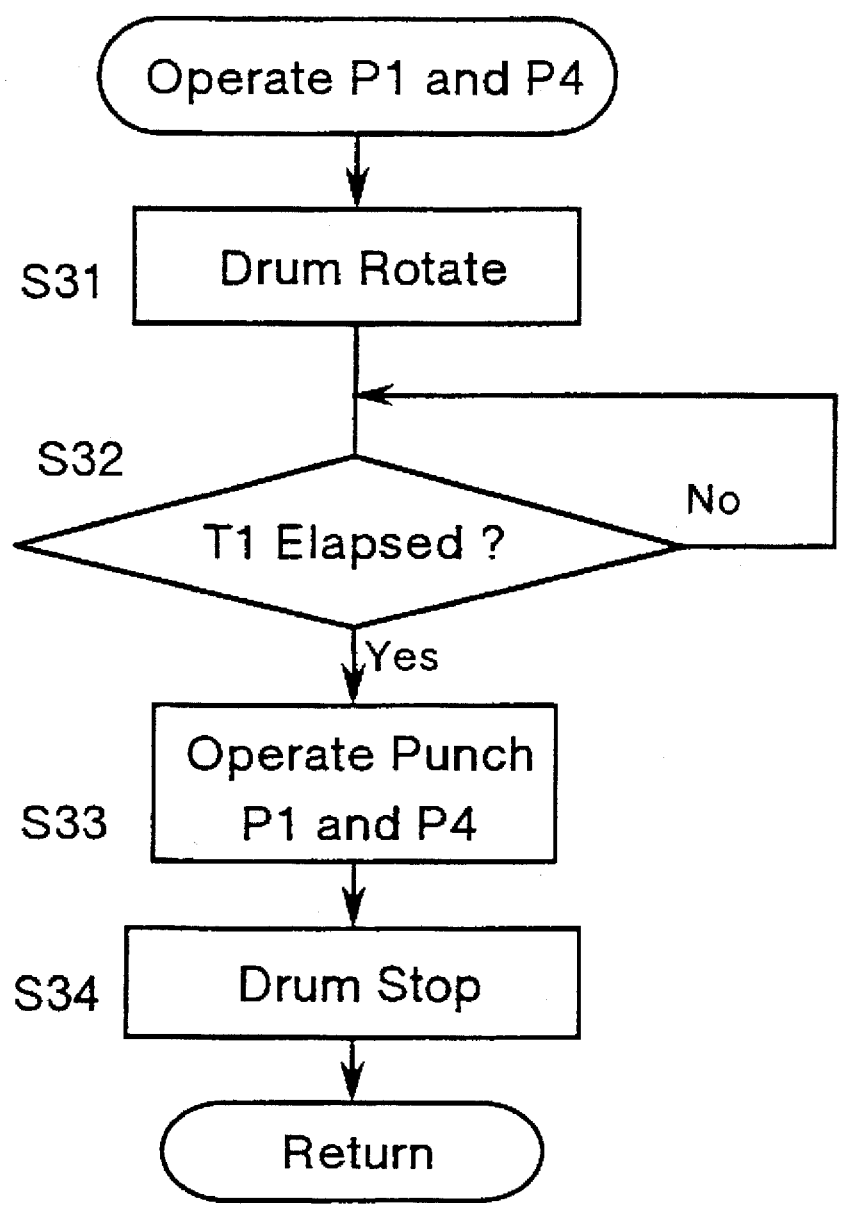
FIG. 9 is still another control flowchart of the punch processing operation.

FIG. 9 shows the detailed flow of step S18. In step S31, the recording drum 11 is rotated. Here, as stated above, compared to the rotation speed during image recording, the recording drum rotates quite slowly. Next step S32 waits for time T1 to elapse. The time T1 is the time from when the recording drum 11 begins rotating until the components of punch units P1 and P4 are aligned. When time T1 elapses, the flow moves to step S33, the die 20 are moved to the punch position by activating both die solenoids 25, punch holes are formed by activating the punch solenoids 35a of punch units P1 and P4, and the dies 20 are then moved to the shelter position by deactivating the two die solenoids 25. After these operations, the flow moves to step S34 and the drum rotation stops. In this way, two punch holes are formed on the photo-sensitive material along the axial direction of the recording drum 11.

The operation of all four punch units P1 through P4 (FIG. 7 step S19) is similar in nature to the operation described with respect to FIG. 8, combined with operations described with respect to FIG. 9, therefore an explanation of the operation referred to at S19 is not provided, being redundant.

When the punch operation executes, the die 20 and the punch 31 are roughly positioned by using the feedback from the encoder 52 in the motor 53. After the rough positioning, the positioning solenoid 38 is advanced to couple with the positioning hole 40 and accurately align the components of the punch units. The die is then lowered by the die solenoid 25 such that the coupling protrusion 27 engages the coupling hole 33 and thus allows accurate positioning between the punch pin 31 and the die hole 26.

In the first preferred embodiment, the dies 20 can be sheltered away from surface of the photo-sensitive material F. The space between the dies 20 and the rotating photo-sensitive material F on the drum 11 is widened while the photo-sensitive material F is being exposed making it difficult for the photo-sensitive material F to be scratched. Further, the solenoids 25 and 35 are disposed on the main frame body 17 and therefore, the wiring that supplies electricity to the solenoids may be simplified.

Figure 10:
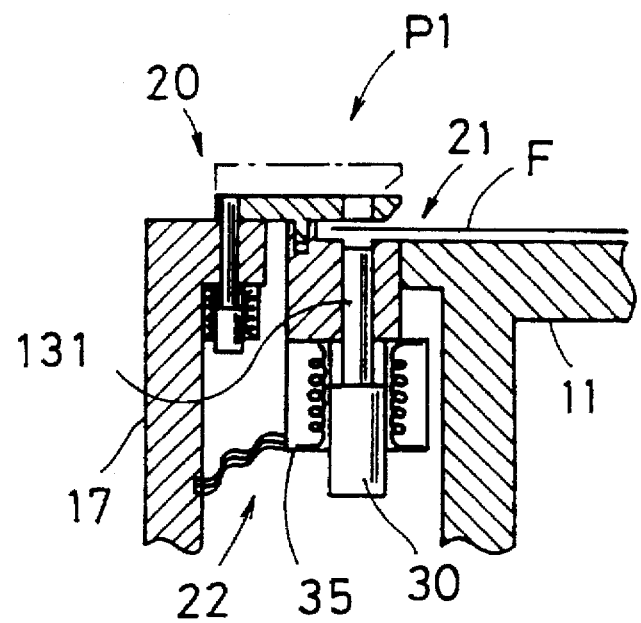
FIG. 10 is a fragmentary, part elevation, part section of the punch unit in accordance with a second embodiment of the present invention.

In a second embodiment of the present invention, as shown in FIG. 10, a punch assembly 21 and drive assembly 22 are disposed on the recording drum 11 and the dies 20 are disposed the main frame body 17. Here, a solenoid shaft serves as a punch pin 131, further simplifying the structure. Because operation is operation of this embodiment is almost identical to the previously stated first embodiment the explanation will be omitted.

Figure 11:
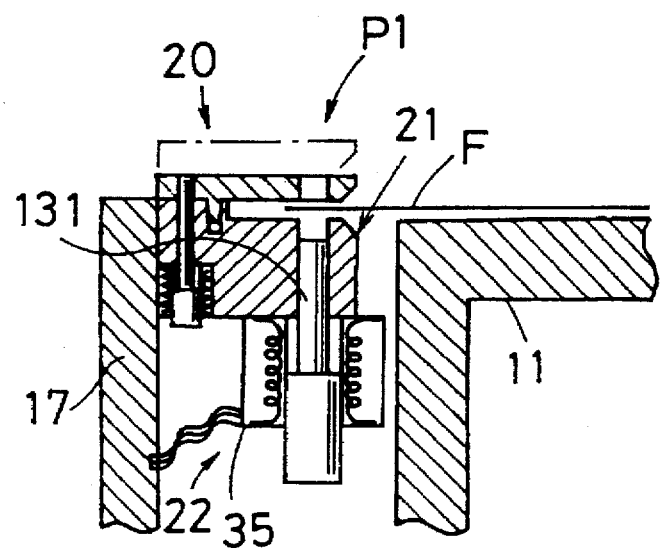
FIG. 11 is a fragmentary, part elevation, part section of the punch unit in accordance with a third embodiment of the present invention.

In a third embodiment of the present invention, as shown in FIG. 11, the die 20, punch assembly 21 and drive assembly 22 are all disposed in the main frame body 17, and the photo-sensitive material F extends over the edge of the recording drum 11. In this embodiment, punch holes can be formed at arbitrary positions along the periphery of the photo-sensitive material F attached to the recording drum 11 by adjusting the amount of rotation of the recording drum 11. Because the operation of this embodiment is almost identical to the previously stated first embodiment the explanation will be omitted.

Figure 12:
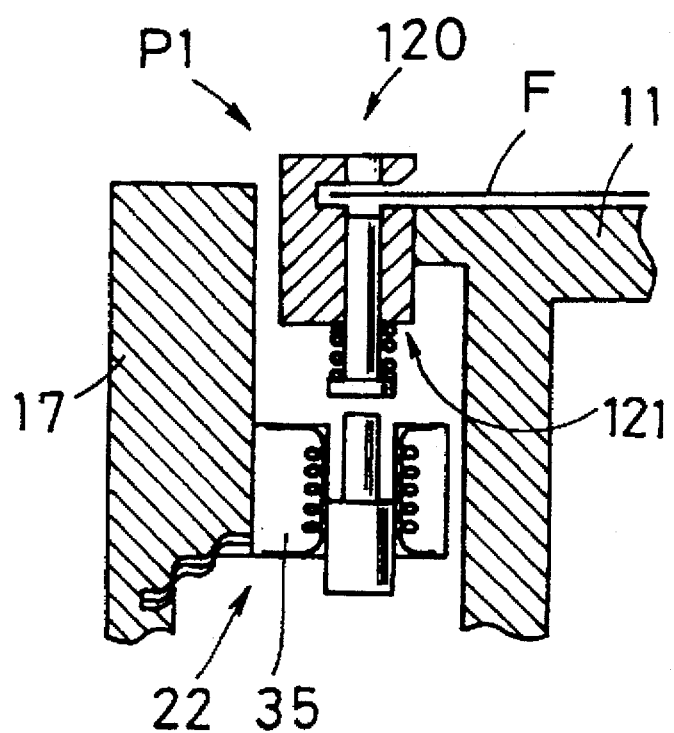
FIG. 12 is a fragmentary, part elevation, part section of the punch unit in accordance with a fourth embodiment of the present invention.

In a fourth embodiment of the present invention, as shown in FIG. 12, the drive assembly 22 is disposed on the main frame body 17 and a die 120 and a punch assembly 121 are disposed on the recording drum 11, with the die 120 integral with the recording drum 11. Further, the die 120 is arranged to be a part of the punch assembly 121. In this embodiment the number of punch solenoids 35 is limited to one on each side of the recording drum.

Figure 13:
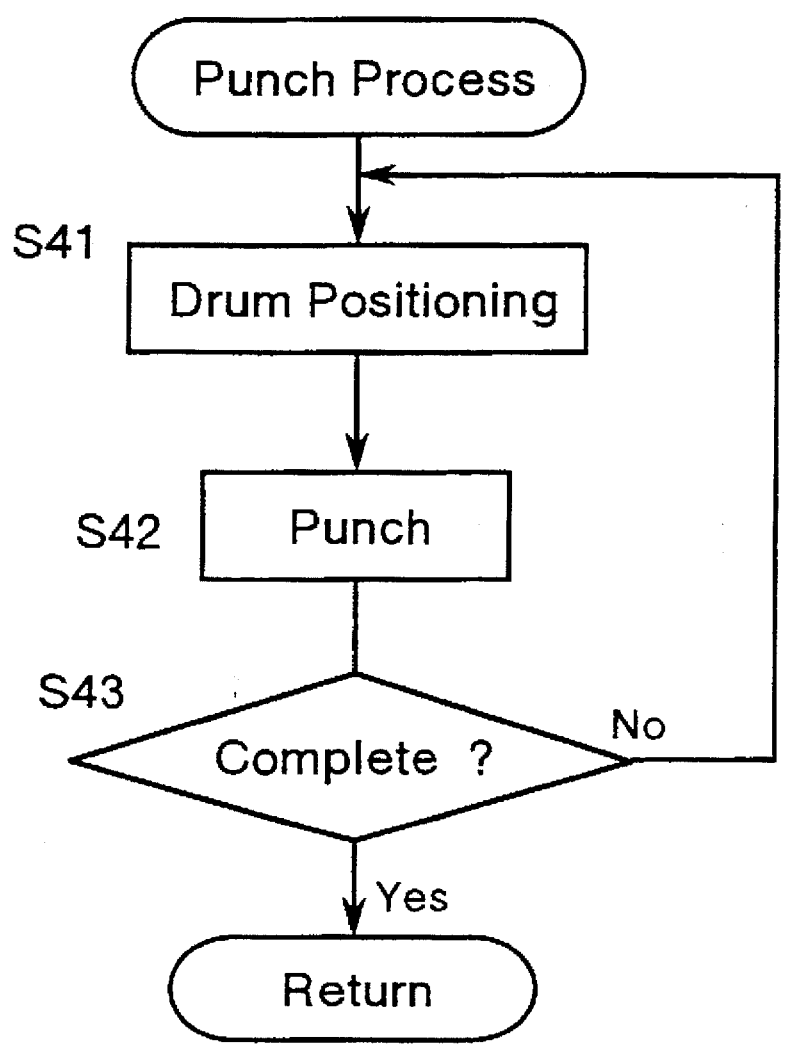
FIG. 13 is a control flowchart of the punch processing operation of the punch unit shown in FIG. 12.

For this type of punch processing operation, as shown in FIG. 13, the recording drum 11 is positioned in step S41 so as to align the punch assembly 121 and the drive assembly 22 opposite with each other. Then, in step S42, the punch solenoid 35 initiates the punch process. In step S43, a judgment is made as to whether all the punch holes have been made. If all the punch holes have not been made, the flow returns to step S41, the recording drum 11 is rotated and the next punch assembly 121 is aligned with the drive assembly 22. Then, when the formation of all the punch holes is complete, the flow returns to the main routine.

Here, because the punch and die are fixed, positioning between them is not necessary and the only necessary positioning is between the punch assembly 121 and drive assembly 22. Because of this, the positioning solenoid 38 is not required, with rough positioning possible by using only the output of the encoder 52.

Figure 14:
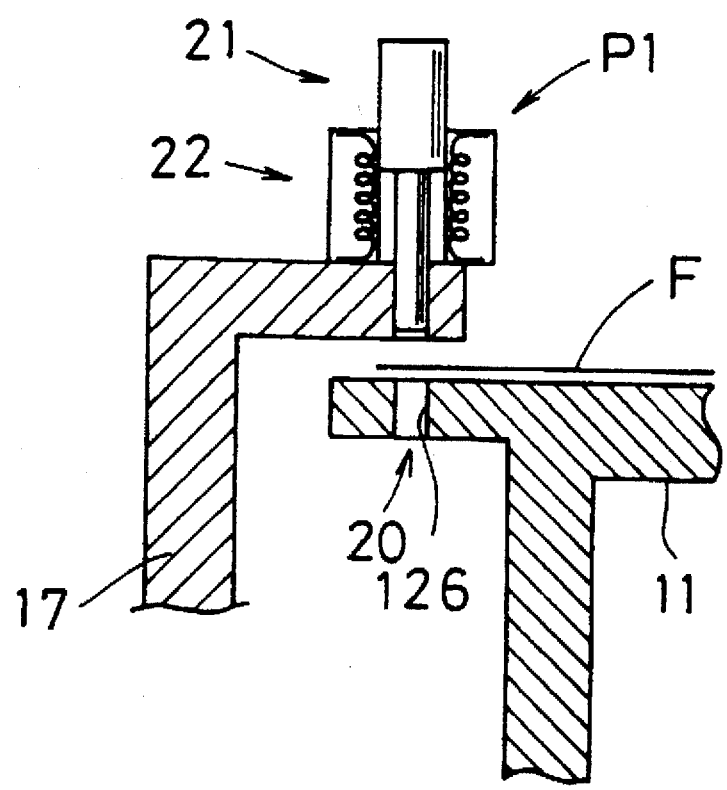
FIG. 14 is a fragmentary, part elevation, part section of the punch unit in accordance with a fifth embodiment of the present invention.

In a fifth embodiment of the invention, as shown in FIG. 14, the punch assembly 21 of punch unit P1 and the drive assembly 22 are disposed on the main frame body 17 to be above the surface of the recording drum 11. A plurality of die holes 126 are disposed on the outer periphery of the recording drum 11. In other words, in this embodiment the recording drum 11 and die are integral. Because a separate die is not necessary and only one punch assembly 21 and one drive assembly 22 are needed for this embodiment, the structure is simplified.

The punch processing operation for the fifth embodiment is almost identical to the one shown in FIG. 13. However, for the positioning in step S41, the positioning solenoid 38 is required in order to carry out accurate positioning between the die 20 and the punch assembly 21.

Figure 15:
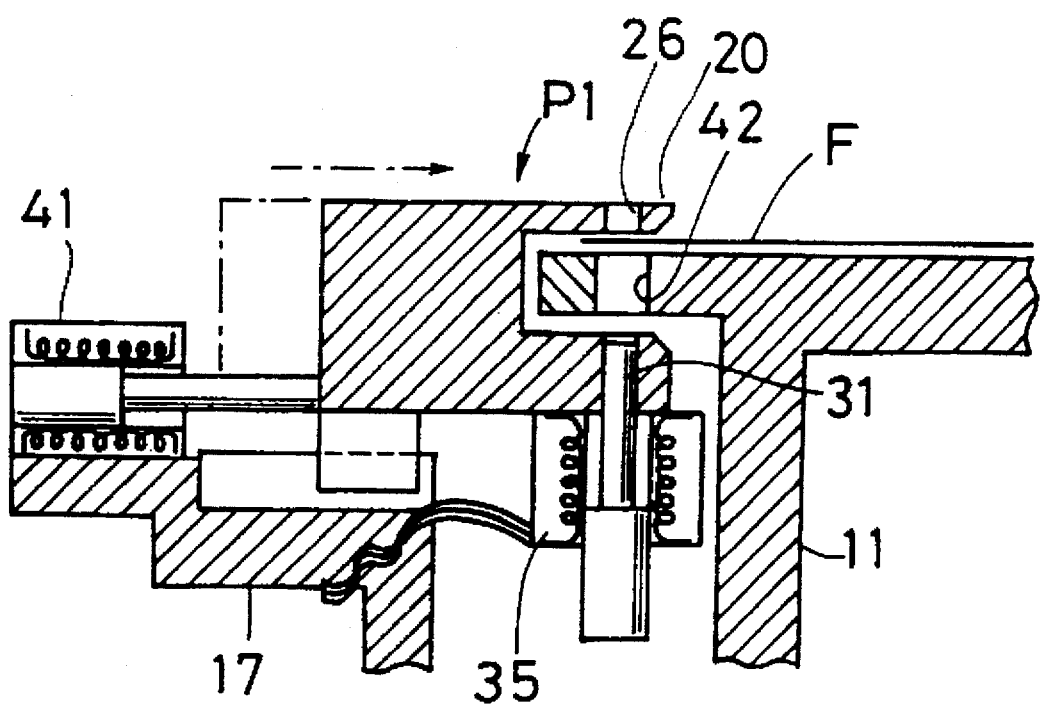
FIG. 15 is a fragmentary, part elevation, part section of the punch unit in accordance with a sixth embodiment of the present invention.

In a sixth embodiment of the invention, as shown in FIG. 15, punch unit P1 is disposed on the main frame body 17 so that it may be selectively moved toward or away from the peripheral surface of the recording drum 11 by means of the activation or deactivation of a solenoid 41 connected to the punch unit P1. A punch solenoid 35 and punch pin 31 are disposed on the lower portion of punch unit P1 and a die 20 and a hole 26 is disposed on the upper portion. On the outer periphery of the recording drum 11 a through hole 42 is formed for the punch pin 31 to pass through. The diameter of this through hole 42 is much larger than the diameter of the punch pin 31.

Figure 16:
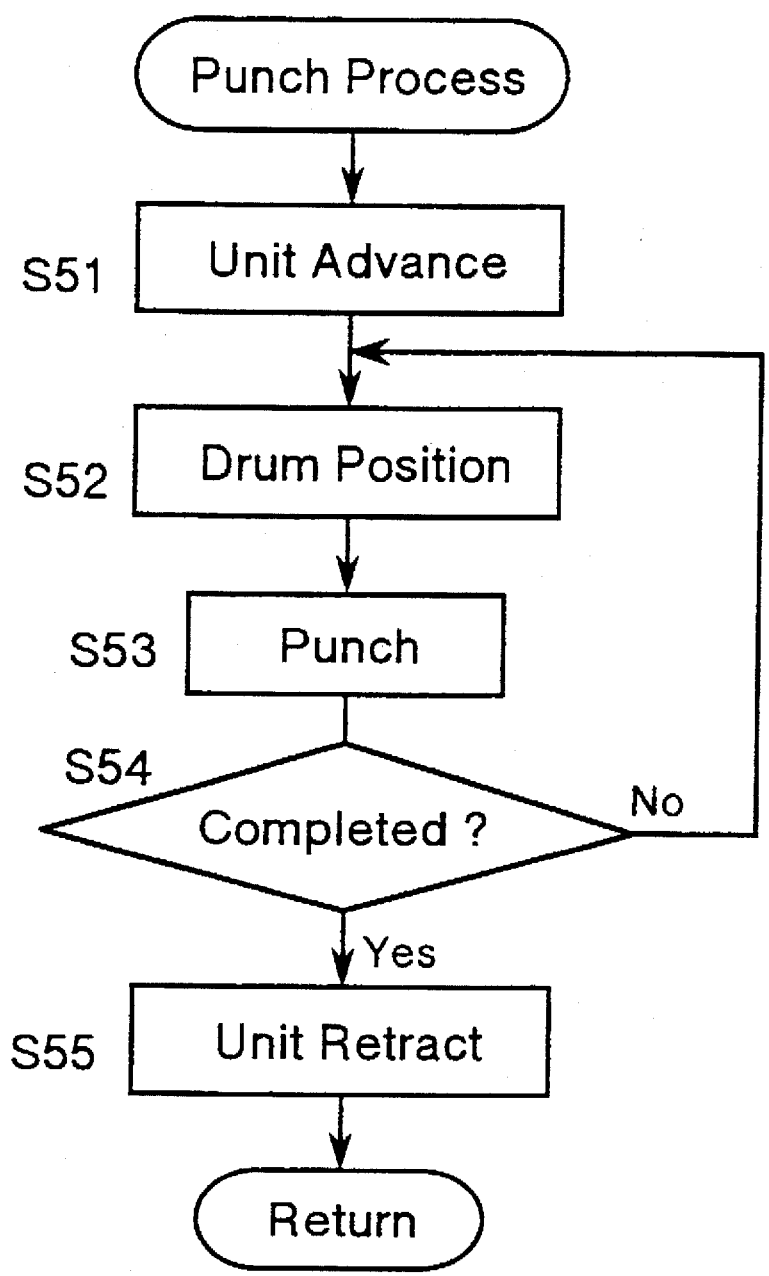
FIG. 16 is a control flowchart of the punch processing operation of the punch unit shown in FIG. 15.

As shown in FIG. 16, in this punch processing operation, initially in step S51 the punch unit P1 is moved toward the recording drum 11 by the activation of the solenoid 41. In step S52, the through hole 42 is aligned with the components of the punch unit P1 by the rotation of the recording drum 11. In step S53, the punch process is carried out by activating punch solenoid 35. In step S54, a judgment is made as to whether the hole punching process is complete. If the hole punching process is not complete, the flow returns to step S52 and the recording drum 11 is rotated to the next position. When the hole punching process is complete, the flow moves to step S55, the solenoid 41 is deactivated and the punch unit P1 moves away from the recording drum 11 and the flow returns to the main routine.

Here, because the punch unit P1 is located in the main frame body 17, only one punch unit P1 is necessary because the recording drum 11 may be rotated to align the holes in the peripheral edge of the recording drum 11 with the punch unit P1 and make the necessary number of holes in the photo-sensitive material F, thereby simplifying the structure.

Figure 17:
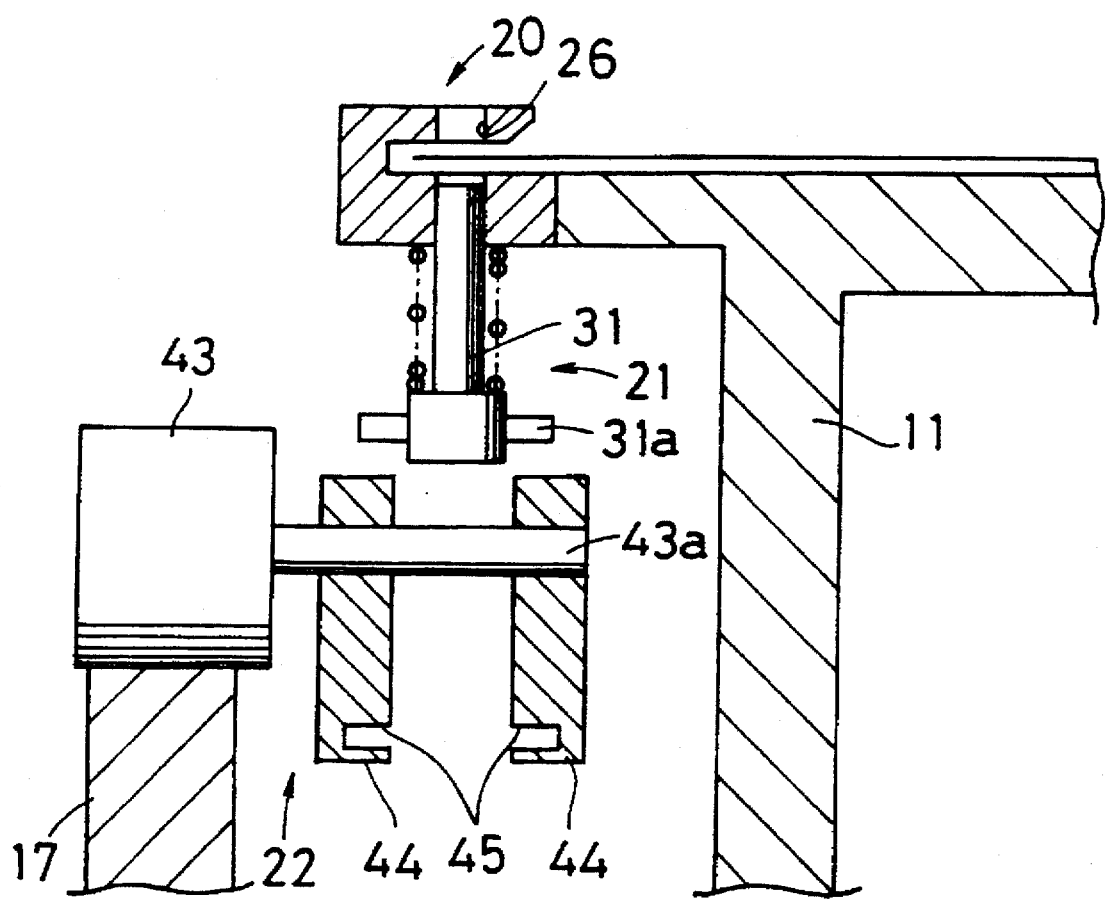
FIG. 17 is a fragmentary, part elevation, part section of a punch unit in accordance with a seventh embodiment of the present invention.
Figure 18:
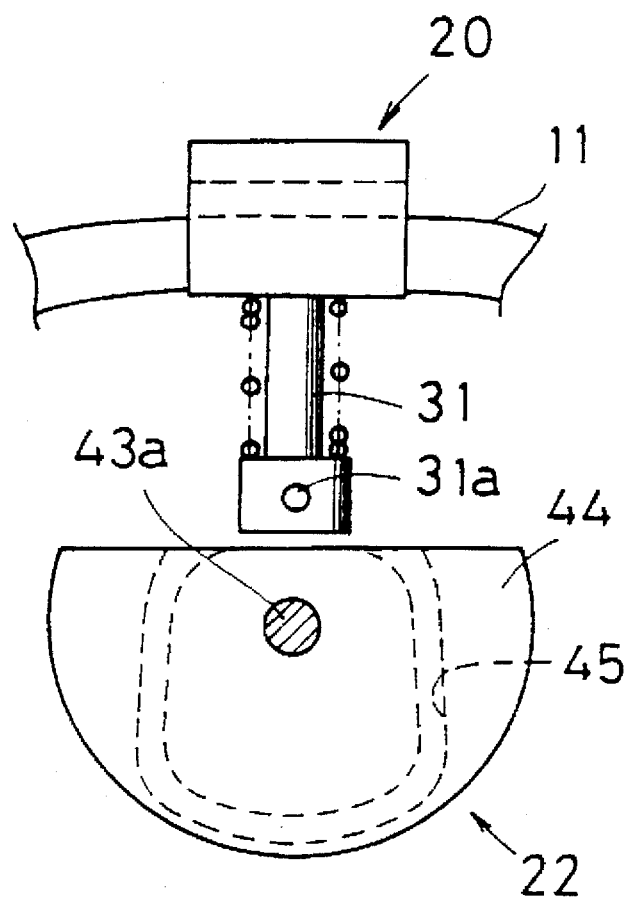
FIG. 18 is a fragmentary, part elevation, part section side view of the punch unit depicted in FIG. 17.

In a seventh embodiment of the invention, another driving means such as an air cylinder or motor can be used in place of a solenoid. For example, as shown in FIGS. 17 and 18, the punch pin 31 can be raised or lowered by means of the drive means 22 having a cam motor 43 fixed to the main frame body 17 and a pair of cams 44 fixed to a cam shaft 43a. Semi-circular cam grooves 45 are formed on both of the inner surfaces of the cams 44. A pair of pins 31a extend from the lower portion of punch pin 31. These pins 31a couple with the cam grooves 45. Other structures and operations are the same as the embodiment shown in FIG. 12 and 13 so the explanation will be omitted.

Figure 19A:
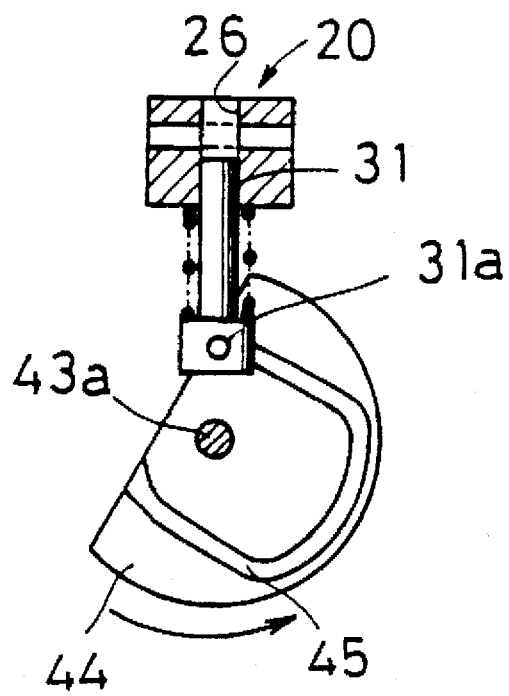
FIG. 19 A and B are similar to FIG. 18, showing relative positions of a cam.
Figure 19B:
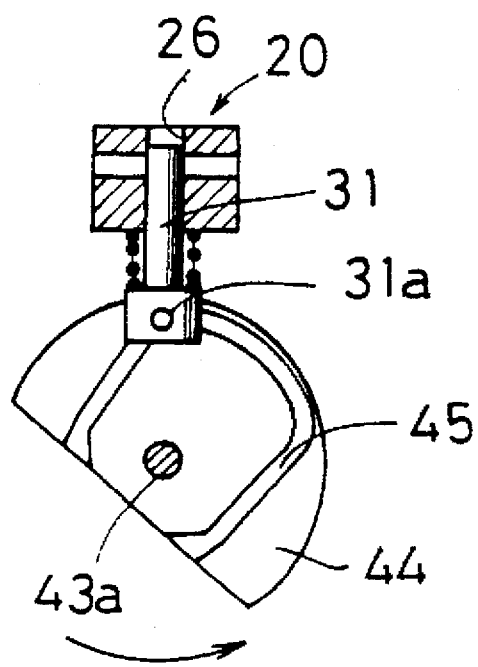

During the punch operation in step S42 of FIG. 13, the cam motor 43 rotates the cams 44 from the position shown in FIG. 18. Then, when the cams 44 rotate to the position shown in FIG. 19 (A), the pins 31a couple with the cam grooves 45 and the punch pin 31 begins to gradually rise. When the cams 44 rotate to the position shown in FIG. 19 (B), punch holes are opened in the photo-sensitive material F. As the cams 44 continue their rotation, the punch gradually lowers and returns to its lowered position and the cams 44 return to the position shown in FIG. 18.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed:

1. A punch mechanism for forming alignment holes in photo-sensitive material disposed on a recording drum within an image recording device, said punch mechanism comprising:
   at least one punch pin;
   at least one die, said die having a hole associated with said punch pin, the at least one punch pin and at least one die forming a punch unit; and
   a drive means for driving said punch pin to form punch holes in the photo-sensitive material, said drive means including a positioning means for positioning said recording drum so each member of said punch unit works together;
   wherein said drive means is disposed in a main frame body of said image recording device and at least one of said punch pin or said die is mounted on said recording drum.

2. The punch mechanism as in claim 1, wherein said die is mounted on said main frame body and said punch pin is mounted along an outer periphery of said recording drum.

3. The punch mechanism as in claim 2, further comprising a plurality of punch pins.

4. The punch mechanism as in claim 3, wherein an extending surface is formed integrally with said die; and
   said punch mechanism further comprises a movement means for relative movement of said extending surface with respect to said recording drum.

5. The punch mechanism as in claim 2, wherein an extending surface is formed integrally with said die; and
   said punch mechanism further comprises a movement means for relative movement of said extending surface with respect to said recording drum.

6. The punch mechanism as in claim 1, wherein said punch pin is disposed in said main frame body and said die is mounted on an outer periphery of said recording drum.

7. The punch mechanism as in claim 6, further comprising a plurality of dies.

8. The punch mechanism as in claim 6, further comprising a movement means for relative movement of said punch pin with respect to said recording drum.

9. The punch mechanism as in claim 7, further comprising a movement means for relative movement of said punch pin with respect to said recording drum.

10. A punch mechanism for forming alignment holes in photo-sensitive material disposed on a recording drum within an image recording device, said punch mechanism comprising:
    at least one punch pin;
    at least one die, said die having a hole associated with said punch pin, the at least one punch pin and die forming a punch unit; and
    a drive means for driving said punch pin, said drive means including a positioning means for positioning a said recording drum to enable said punch unit to form punch holes at desired positions in said photo-sensitive material;
    wherein each element of said punch unit is mounted on a main frame body of the image recording device.

11. The punch mechanism as in claim 10, wherein an extending surface is formed integrally with said die; and
    said punch mechanism further comprises a movement means for relative movement of said extending surface with respect to said recording drum.

12. A punch mechanism as in claim 11, wherein said extending surface is moveable by said movement means in axial directions with respect to said recording drum.

13. A punch mechanism as in claim 12, wherein said movement means moves said extending surface in a direction away from said recording drum before starting an image recording operation on said photo-sensitive material disposed on said recording drum.

14. A punch mechanism as in claim 12, wherein said movement means moves said extending surface in a direction away from said recording drum prior to mounting said photo-sensitive material on said recording drum.

15. A punch mechanism as in claim 11, wherein said extending surface is moveable by said movement means in radial directions with respect to said recording drum.

16. A punch mechanism as in claim 15, wherein said movement means moves said extending surface in a direction away from said recording drum before starting an image recording operation on said photo-sensitive material disposed on said recording drum.

17. A punch mechanism as in claim 15, wherein said movement means moves said extending surface in a direction away from said recording drum prior to mounting said photo-sensitive material on said recording drum.

18. The punch mechanism as in claim 10, further comprising a movement means for relative movement of said punch pin with respect to said recording drum.

19. A punch mechanism as in claim 18, wherein said extending surface is moveable by said movement means in axial directions with respect to said recording drum.

20. A punch mechanism as in claim 19, wherein said movement means moves said extending surface in a direction away from said recording drum before starting an image recording operation on said photo-sensitive material disposed on said recording drum.

21. A punch mechanism as in claim 19, wherein said movement means moves said extending surface in a direction away from said from said recording drum before starting an image recording operation on said photo-sensitive material disposed on said recording drum.

22. A punch mechanism as in claim 18, wherein said extending surface is moveable by said movement means in radial directions with respect to said recording drum.

23. A punch mechanism as in claim 22, wherein said movement means moves said extending surface in a direction away from said recording drum prior to mounting said photo-sensitive material on said recording drum.

24. A punch mechanism as in claim 22, wherein said movement means moves said extending surface in a direction away from said recording drum prior to mounting said photo-sensitive material on said recording drum.

* * * * *